US005828763A

United States Patent [19]

Koyano et al.

[11] Patent Number: 5,828,763

[45] Date of Patent: Oct. 27, 1998

[54] SPEAKER SYSTEM INCLUDING PHASE SHIFT SUCH THAT THE COMPOSITE SOUND WAVE DECREASES ON THE PRINCIPAL SPEAKER AXIS

[75] Inventors: Shinji Koyano; Koushiro Kogure; Yuichi Saito, all of Saitama, Japan

[73] Assignee: Pioneer Electronic Corporation, Tokyo, Japan

[21] Appl. No.: 43,610

[22] Filed: Apr. 5, 1993

Related U.S. Application Data

[63] Continuation of Ser. No. 676,007, Mar. 27, 1991, abandoned.

[30] Foreign Application Priority Data

Aug. 31, 1990 [JP] Japan .................................... 2-231370

[51] Int. Cl.[6] ................................ H03G 3/00; H03G 5/00

[52] U.S. Cl. ................................ 381/97; 381/98; 381/61

[58] Field of Search ................................ 381/97, 98, 99, 381/59, 24, 17, 63, 61

[56] References Cited

U.S. PATENT DOCUMENTS

| | | | |
|---|---|---|---|
| 4,146,745 | 3/1979 | Froeschle et al. | 381/158 |
| 4,410,063 | 10/1983 | Yasue et al. | 381/99 |
| 4,503,553 | 3/1985 | Davis | 381/24 |
| 4,817,162 | 3/1989 | Kihara | 381/97 |
| 4,873,722 | 10/1989 | Tominari | 381/17 |
| 4,908,858 | 3/1990 | Ohno | 381/98 |
| 5,033,092 | 7/1991 | Sadaie | 381/97 |
| 5,121,433 | 6/1992 | Kendall et al. | 381/97 |

FOREIGN PATENT DOCUMENTS

| | | | |
|---|---|---|---|
| 52-33517 | 3/1977 | Japan | 381/97 |
| 61-42900 | 6/1986 | Japan | 381/97 |
| 0281799 | 12/1986 | Japan | 381/97 |
| 63-300699 | 12/1988 | Japan | 381/97 |
| 1-4200A | 1/1989 | Japan | 381/97 |
| 1248079 | 7/1986 | U.S.S.R. | 381/97 |
| 1248080 | 7/1986 | U.S.S.R. | 381/97 |
| 1456790 | 11/1976 | United Kingdom | 381/97 |

*Primary Examiner*—Jack Chiang
*Attorney, Agent, or Firm*—Sughrue, Mion, Zinn, Macpeak & Seas, PLLC

[57] ABSTRACT

A speaker system for reproducing a high fidelity sound field. In one embodiment, the speaker system includes at least two speakers, one of which is coupled with a phase shifter for shifting the phase of an audio signal in mid- and high-frequency ranges. The phase shifter shifts the phase between ±120° and ±180°. In another embodiment, the speaker system includes three speakers and the phase shifter shifts the phase of the audio signal applied to two of the speakers from that of the audio signal applied to the third speaker which is a tweeter.

5 Claims, 9 Drawing Sheets

SPEAKER SYSTEM INCLUDING PHASE SHIFT SUCH THAT THE COMPOSITE SOUND WAVE DECREASES ON THE PRINCIPAL SPEAKER AXIS

This is a continuation of application Ser. No. 07/676,007 filed Mar. 27, 1991 now abandoned.

BACKGROUND OF THE INVENTION

1. Field of the Invention

The present invention relates to a speaker system for reproducing a high fidelity sound field.

2. Description of the Prior Art

In the audio reproduction technology, particularly the Hi-Fi reproduction technology, one of the objects is to reproduce an original sound field with a high fidelity. However, it is very difficult to reproduce all of the factors in an original sound field because such factors include sound reflection by walls. For example, in the sound reproduction field the size of the walls may be different from those in the original sound field. The term “sound field” means a region that contains a sound spatially radiated from a speaker and sound reflected by walls and other items in a listening room.

In the original sound field, a listener obtains the information of a sound, which contains complicated reverberation and the like in addition to an original sound. Further, the listener also obtains a visual informtion in the original sound field. Accordingly, in the Hi-Fi reproduction, the original sound must be reproduced in a way capable of compensating the supplementary information, such as the spatial information and visual information which cannot be realized in the reproduction field.

An original sound generating system, such as a surround system and a presence stereo system, has been proposed and practically used as a sound field reproduction technique.

The surround system reproduces the “presence information” contained in an original stereo sound, which is recorded in a sound field, by shifting the phase of the audio signal in the L-channel with respect to that in the R-channel and vice versa.

The presence stereo system uses main speakers, and sub-speakers disposed in the right and left forward directions as viewed from a listener. An angle of lines connecting the right and left places to the listener at the listener position is chosen so that the sounds radiated from both the sub-speakers do not directly reach the listener. An audio signal is supplied to the sub-speakers with a delay of between several msec. and tens of msec. after the supply of the audio signal to the main speakers. The sounds radiated from the sub-speakers are reflected by the walls and scattered.

In the speaker systems as described above, the directivity of the sound wave radiated from the speaker becomes sharper the higher the frequency of the audio signal. Accordingly, the sensitivity of a direct sound of high frequency, which contributes to the perception of a sound source position, becomes high. Where the sensitivity of the direct sound is high, the presence of the sound becomes poor, and the presence information of the original sound is poorly reproduced.

SUMMARY OF THE INVENTION

Accordingly, an object of the present invention is to provide a speaker system which can reproduce an original sound with a good presence.

Another object of the present invention is to provide a speaker system whose directional characteristics are improved.

These and other objects are accomplished by the speaker system of the present invention.

In a first embodiment of the invention, the speaker system includes at least two speakers, one of which is coupled with a phase shifter for shifting the phase of an audio signal in mid and high-frequency ranges. Specifically, the phase shifter phase-shifts an audio signal applied to one of the speakers in the mid- and high-frequency ranges.

The phase of the audio signal to be shifted is chosen such that the sound wave in the mid- and high-frequency ranges, which is radiated from each of the speakers, decreases on the principal axis of the speaker system.

The audio signal applied to one of the speakers is phase-shifted with respect to that applied to the other by between ±120° and ±180° in the mid- and high-frequency ranges. The reason for this phase-shift is discussed below.

A sensitivity of the sound in the mid- and high-frequency ranges, which results from the combination of the sound waves radiated from both the speakers, decreases on the principal axis of the speaker system because those sound waves, phase-shifted, interact with each other. The phases of the sound waves also become different on both sides of the principal axis of the speaker system, owing to a difference between the traveling paths of the sound waves. Hence, through the increase or decrease control of the original phase-shift caused by the phase shifter, the interaction of the phase-shifted sound waves causes the combined sound wave to increase in the mid- and high-frequency ranges.

With the shifted phase so chosen, the sensitivity of the sound wave in the mid- and high-frequency ranges decreases on the principal axis of the speaker system, and increases on both sides of the principal axis. Accordingly, even if the speaker system is directed towards a listening position, a listener is unable to sense the presence of the speaker system, and therefore a sound field with good presence is created.

According to a second embodiment of the invention, the speaker system includes first and second speakers connected in series, a phase shifter whose output terminals are connected across the series connection of the first and second speakers, input terminals coupled for receiving an audio signal; and a high-pass filter connected to the input terminals, to the input terminals of the phase shifter, and to output terminals of a third speaker. In this embodiment, the third speaker is a tweeter, and the remaining two speakers are each phase-shifted from the tweeter by the phase shifter. With this embodiment, in the polar pattern, the patterns of the sound waves in the mid- and high-frequency ranges are symmetrical with respect to the principal axis (0°). Therefore, the directional characteristics of this speaker system are improved.

According to a third embodiment of the invention, the speaker system includes first and second speakers connected in series; an audio signal applied across the series connection of the first and second speakers; and a phase shifter whose input terminals are coupled for reception with an audio signal and whose output terminals are connected across a third speaker. In this embodiment, the phase shifter shifts the phase of the third speaker from that of each of the first and second speakers.

With such an arrangement, the sensitivity patterns of the sound waves in the mid- and high-frequency ranges are more symmetrical with respect to the principal axis (0°) than in the first embodiment. This provides further improvement of the directional characteristics of the speaker system.

BRIEF DESCRIPTION OF THE DRAWINGS

FIG. 9(*b*) is a graphical representation of the phase/sensitivity characteristics of the speaker when the operation of a high-pass filter in the speaker system is stopped or the high-pass filter is omitted;

FIG. 10(*b*) is a graphical representation of the phase/sensitivity characteristics of the speaker when the phase shifter is operated;

DETAILED DESCRIPTION OF THE PREFERRED EMBODIMENTS

The preferred embodiments of a speaker system according to the present invention will now be described in detail with reference to the accompanying drawings.

Figure 1:
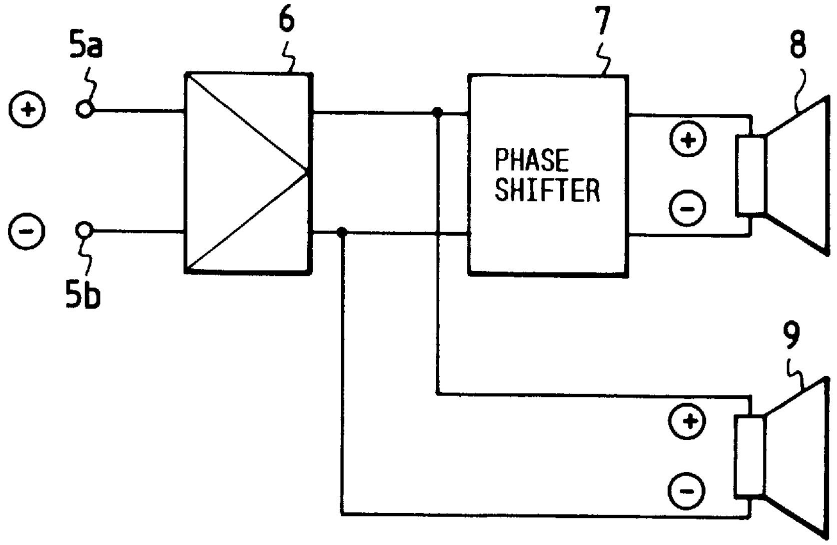
FIG. 1 is a block diagram showing an embodiment of a speaker system according to the present invention.

FIG. 1 is a block diagram showing a first embodiment of a speaker system according to the present invention which includes a power amplifier 6 for amplifying an audio signal, applied at input terminals 5*a* and 5*b*, to a power level sufficient to drive speakers 8 and 9 of the speaker system. The outputs of the power amplifier 6 are coupled with a phase shifter 7 which is able to shift a phase of the audio signal between ±120° and ±180° in the mid- and high-frequency ranges. The outputs of the phase shifter 7 are coupled with the speaker 8 which is of the all-frequency-range type. The outputs of the power amplifier 6 are coupled to another all-frequency-range type speaker 9.

The phase-shift of the phase shifter 7 is determined by properly setting a capacitance C and an inductance L of corresponding elements contained in the phase shifter 7.

The operation of the speaker system thus arranged will now be described.

Figure 2:
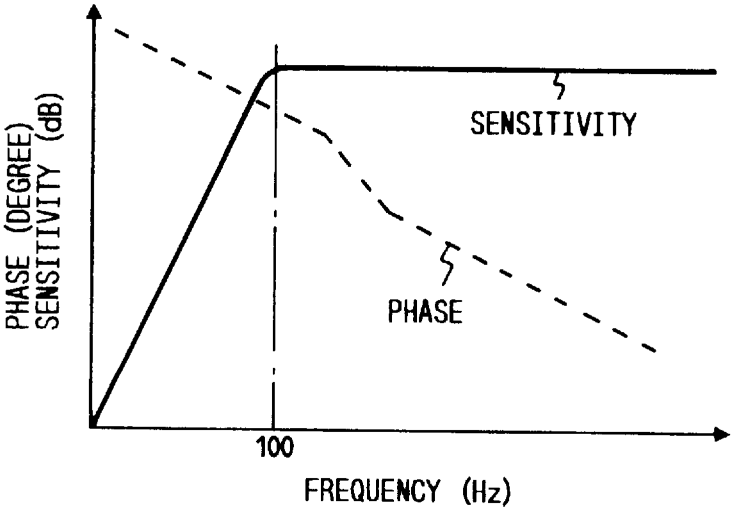
FIG. 2 is a graphical representation of phase and sensitivity characteristics of one of the speakers in the speaker system of FIG. 1.

Phase and sensitivity characteristics of the speaker 8 or 9 connected to the phase shifter 7 are as shown in FIG. 2. As shown, the sensitivity on the principal axis of the speaker system becomes constant at about 100 Hz, and the phase decreases as the frequency increases.

Figure 3:
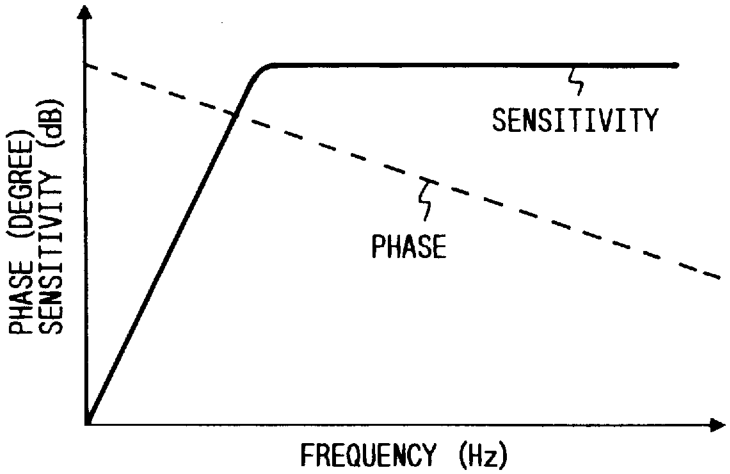
FIG. 3 is a graphical representation of the phase/sensitivity characteristics of the speaker when the operation of a phase shifter in the speaker system is stopped or the phase shifter is omitted.

FIG. 3 shows the phase/sensitivity characteristics of the speaker without the phase shifter 7.

Figure 4:
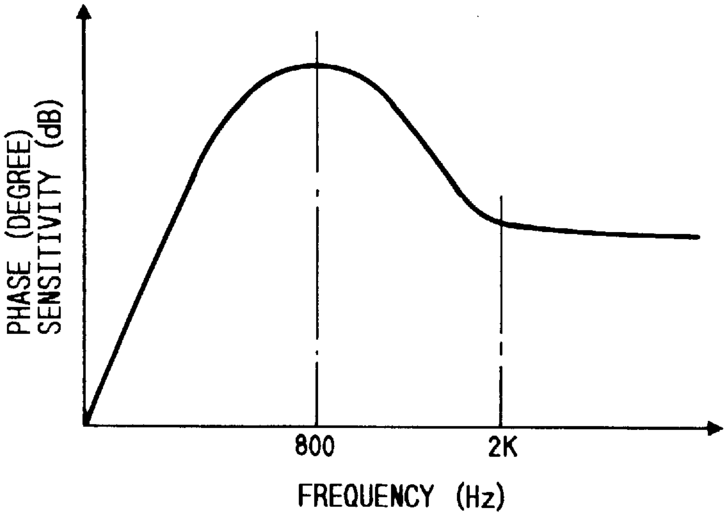
FIG. 4 is a graphical representation of the phase/sensitivity characteristics of the speaker system when one of the speakers in the speaker system is phase-shifted by 180° with respect to that of the other.

When the phase of the speaker 8 is shifted from that of the speaker 9, no phase-shift is present in a very low-frequency range, but the phase-shift increases as the frequency increases within the low-frequency range. Therefore, as shown in FIG. 4, the sensitivity of a sound wave resulting from composing sound waves from the two speakers, which is measured on the principal axis, decreases at about 800 Hz, and becomes constant at about 2 kHz.

Figure 5:
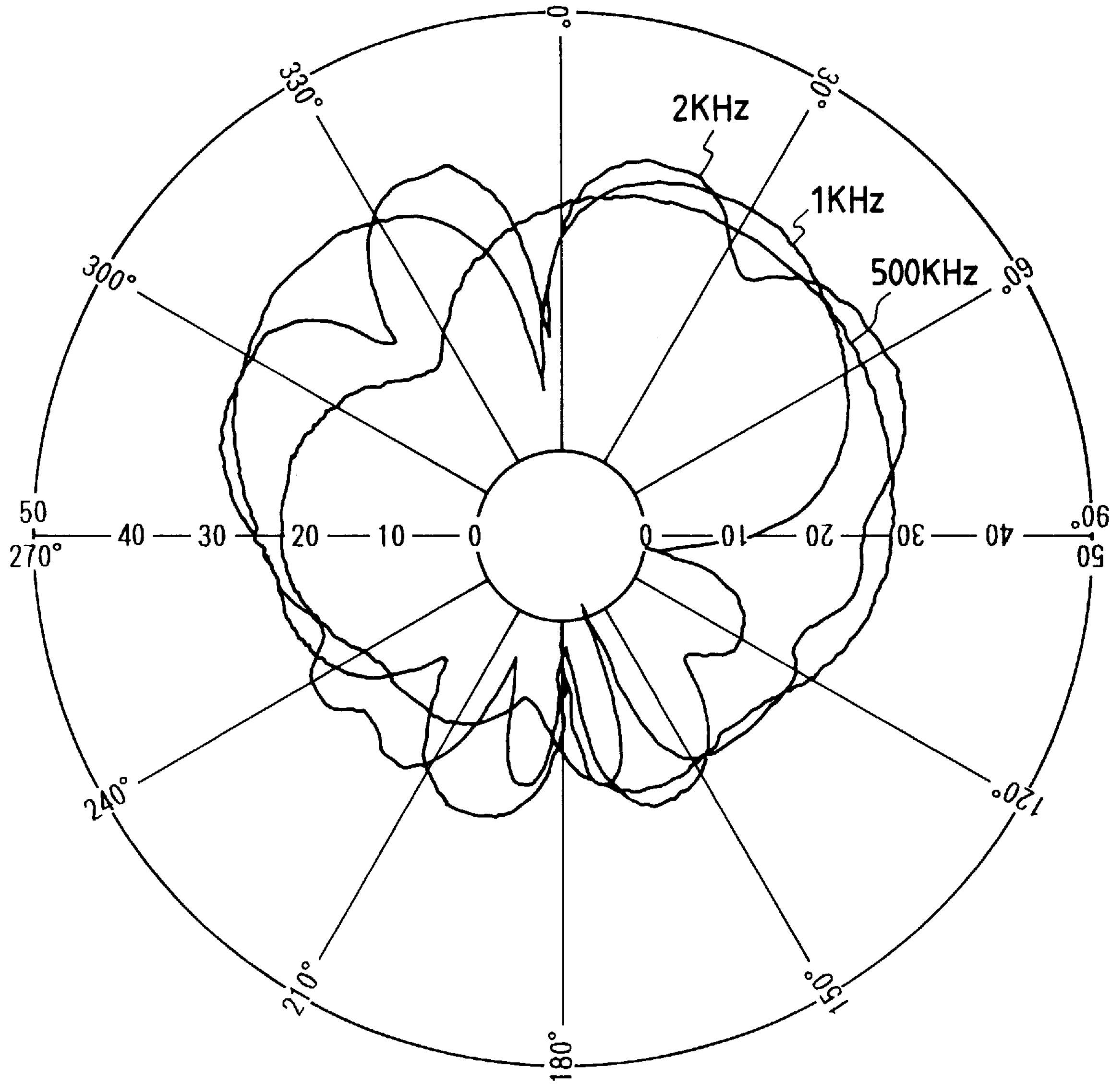
FIG. 5 is a graphical representation showing a polar pattern of the speaker system of FIG. 1.

As a result, as shown in FIG. 5, the audio signals of 1 kHz and 2 kHz, which belong respectively to the mid- and high-frequency ranges, are both small on and around the principal axis of the speaker system, while those audio signals are maximized at about 30° or 315°. The reason for this is that on and around the principal axis (0°) of the speaker system, the sound waves in the mid- and high-frequency ranges become small because of the interaction of the phase-shifted sound waves. On both sides of the principal axis (0°) there exists a difference between the traveling paths of the sound waves emitted from the speakers. Accordingly, the phase of the sound wave from one of the two speakers is different from that of the sound wave from the other on both sides of the principal axis (0°). Hence, if the original phase-shift caused by the phase shifter is increased or decreased, the interaction of the phase-shifted sound waves causes the composed sound wave to increase in the mid- and high-frequency ranges.

The sound wave of 500 Hz, which belongs to the low-frequency range, decreases a little because no difference between the traveling paths of the sound waves from both the speakers is present on and around the principal axis (0°). The level of the 500-Hz sound wave is substantially uniform in every direction.

Figure 6:
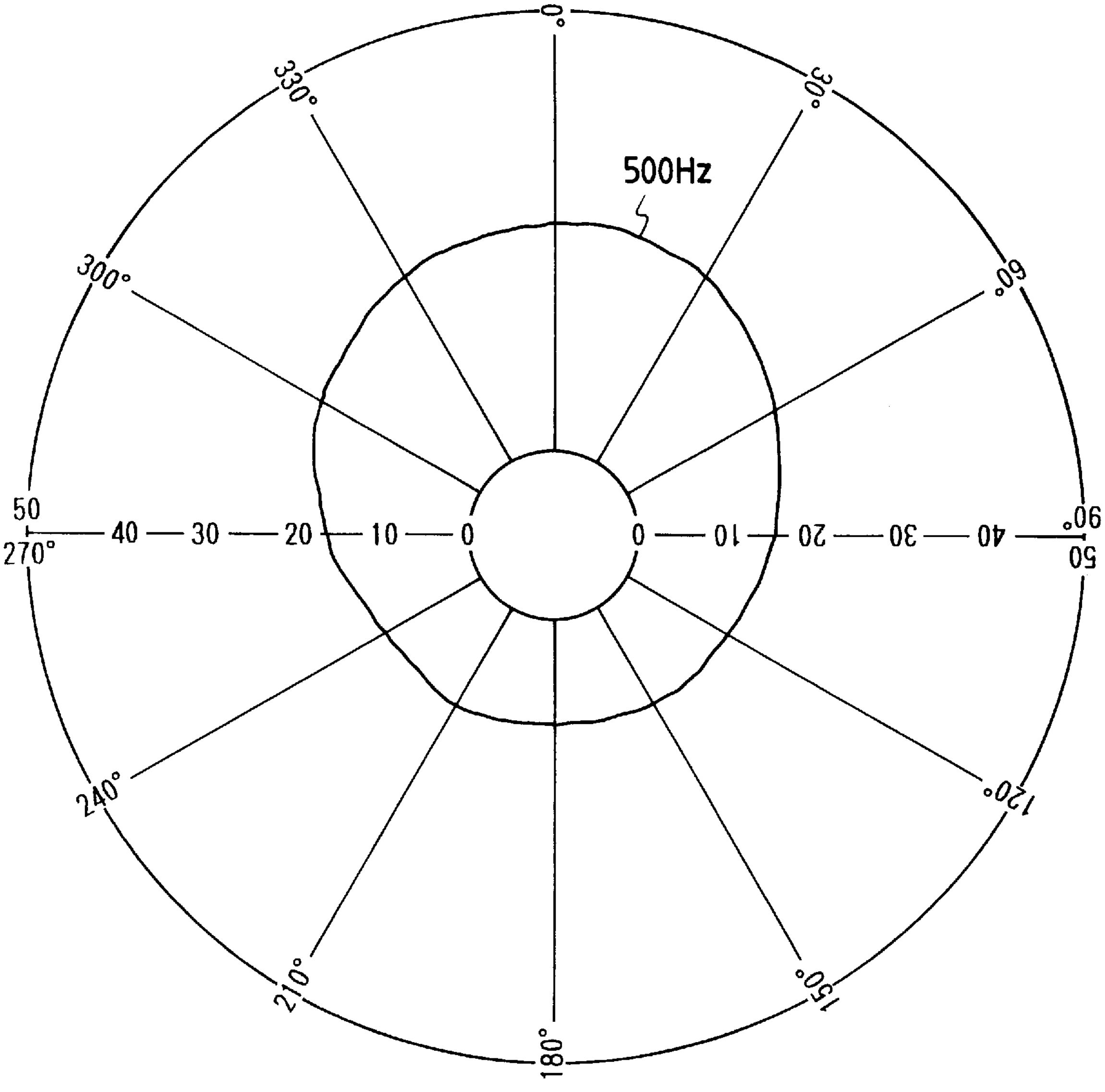
FIG. 6 is graphical representation showing a polar pattern of an ordinary speaker system.

The directional characteristics of an ordinary speaker system are shown in FIG. 6, and the characteristic curve shows that both the high- and low-frequency sound waves are substantially uniformly distributed in every direction.

As described above, in the instant embodiment, the phase of the sound wave radiated from one of the speakers is shifted from that of the sound wave from the other to increase the sensitivity of only the sound wave in the high-frequency range on the principal axis, and so as to decrease the sensitivities of the sound waves in the high-frequency range near the principal axis. Accordingly, even if the speaker system is directed towards a listening position, a listener cannot sense the presence of the speaker system, and therefore sound with good presence is created.

Figure 7:
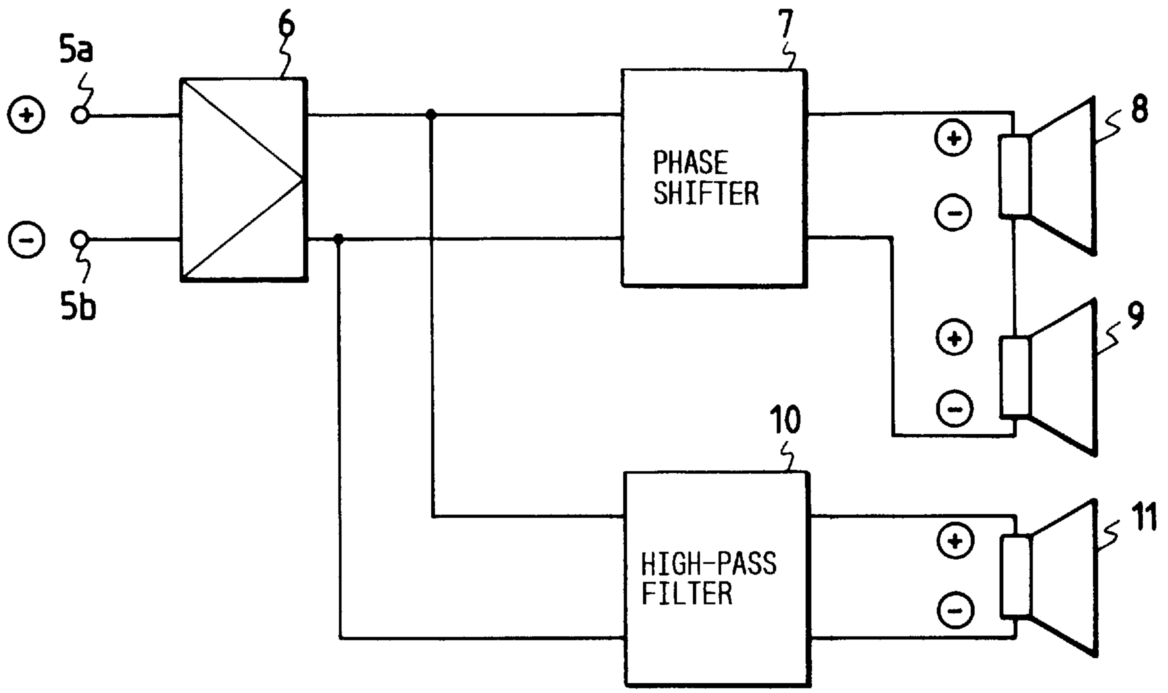
FIG. 7 is a block diagram showing another embodiment according to the invention.

FIG. 7 is a block diagram showing another embodiment of a speaker system according to the present invention. In FIG. 7, like reference symbols are used for designating like or equivalent portions in FIG. 1, for simplicity sake.

As shown in FIG. 7, input terminals 5*a* and 5*b* are connected to all-frequency-range type speakers 8 and 9, through a power amplifier 6 and a phase shifter 7. The outputs of the power amplifier 6, which are connected to the inputs of the phase shifter 7, are connected to an additional all-frequency-range type speaker 11, through a high-pass filter 10 for filtering out the frequency components in the mid- and low-frequency ranges of an audio signal. The speaker 11 is used as a tweeter.

Figure 8:
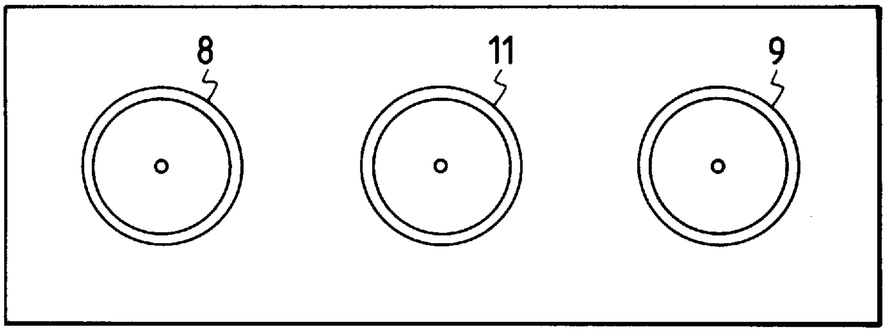
FIG. 8 is a front view showing the speaker arrangement of the speaker system of FIG. 7.

The speakers 8, 9, and 11 are arranged as shown in FIG. 8. Specifically, the speaker 11 is disposed between the speakers 8 and 9.

Figure 9A:
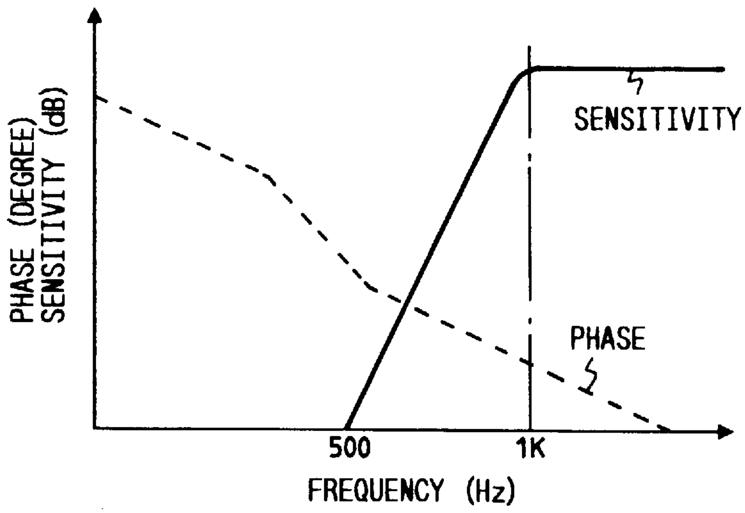
FIG. 9(*a*) is a graphical representation of the phase/sensitivity characteristics of the tweeter in the speaker system of FIG. 7.
Figure 9B:
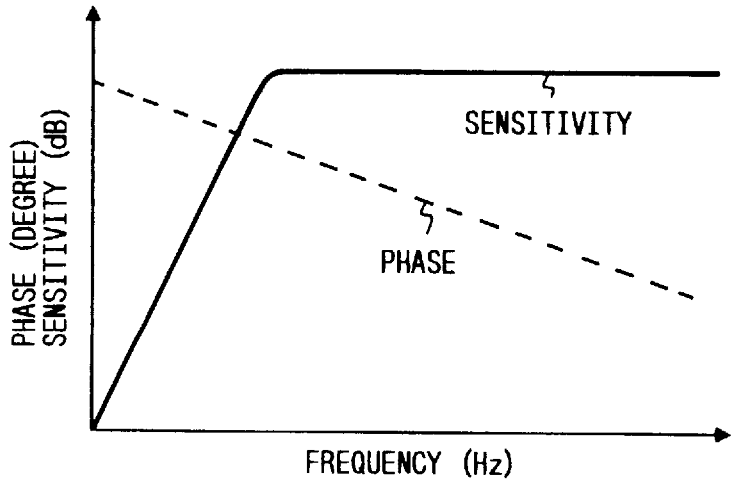

The phase and sensitivity characteristics of the speaker 11 are as shown in FIG. 9(*a*) in which a curve representing the sensitivity on the principal axis rises at about 500 Hz and becomes flat at about 1 kHz. The phase characteristic curve decreases as the frequency increases because the phase shift of the sound wave from a signal source increases as the frequency increases.

When the operation of the high-pass filter 10 is stopped (viz., the filter 10 is omitted), the phase/sensitivity characteristic curves of the speaker system are as shown in FIG. 9(*b*).

As described above, through the operation of the high-pass filter 10, the sensitivity characteristic curve is shifted to the high frequency side, and the phase characteristic is non-linear. Further, the phase characteristic curve, as a whole, decreases.

Figure 10A:
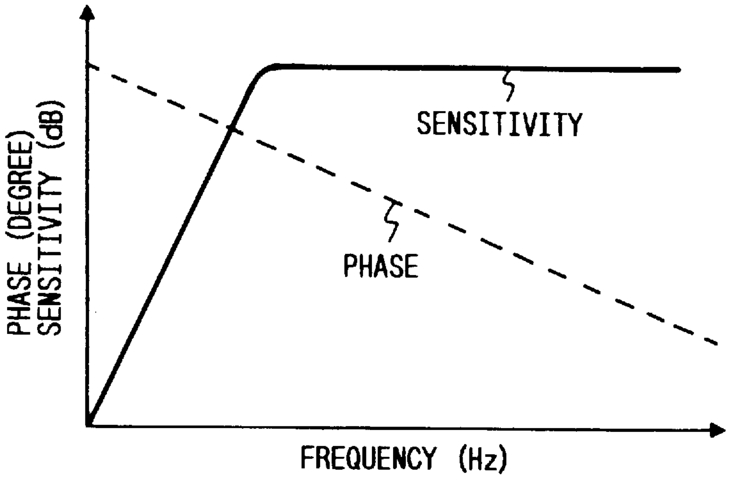
FIG. 10(*a*) is a graphical representation of the phase/sensitivity characteristics of one of the speakers in FIG. 7 when the operation of the phase shifter is stopped or the phase shifter is omitted.
Figure 10B:
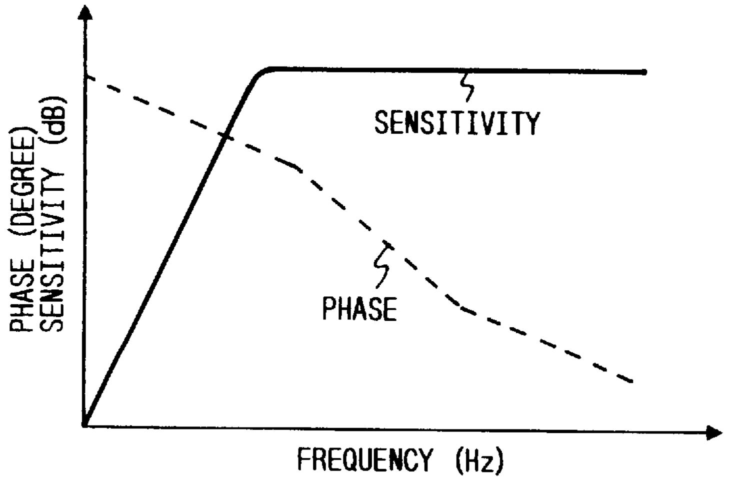

The speakers 8 and 9 each have the phase/sensitivity characteristics as shown in FIG. 10(*a*), and the speakers 8 and 9 are phase-shifted as shown in FIG. 10(*b*).

Figure 11:
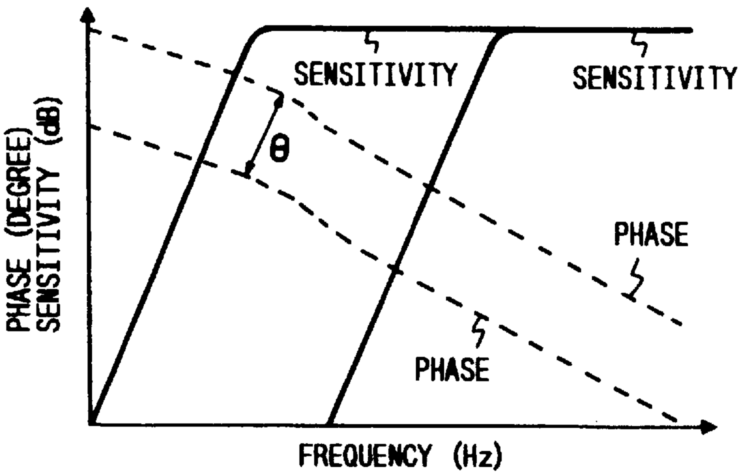
FIG. 11 is a graph showing the phase/sensitivity characteristics of the speaker system of FIG. 7 in which each of the speakers connected to the phase shifter is phase-shifted from the tweeter over all frequency ranges.

When each of the speakers 8 and 9 is phase-shifted from the tweeter 11 by 180°over all of the frequency ranges, the sensitivity characteristics of the speakers 8 and 9 are combined as shown in FIG. 11, resulting in the characteristics shown in FIG. 4.

Figure 12:
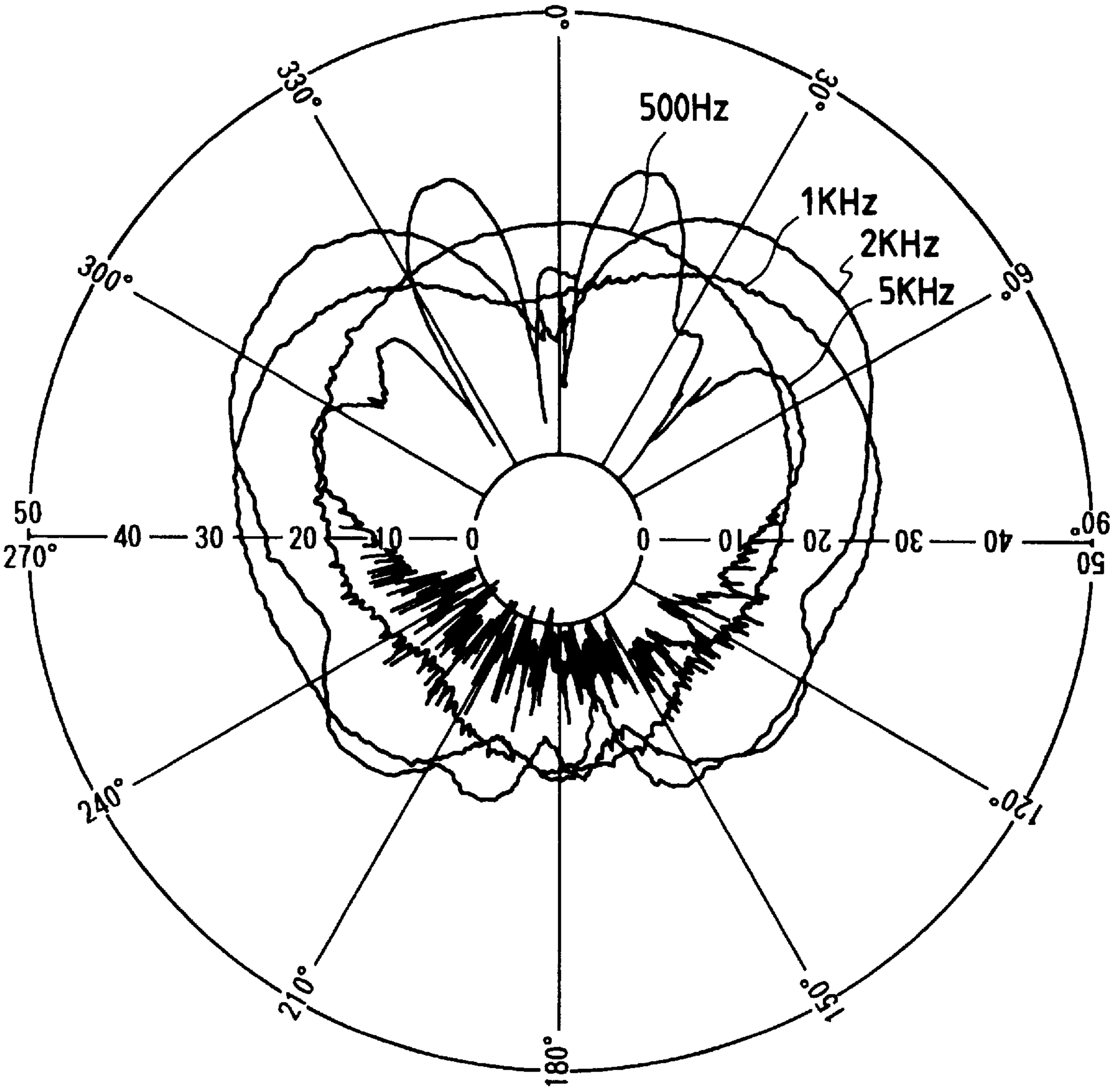
FIG. 12 is a graphical representation showing a polar pattern of the speaker system of FIG. 7.

As a result, as shown in FIG. 12, the sound waves of 1 kHz, 2 kHz, and 5 kHz, which are within the mid- and high-frequency ranges, decrease on and around the principal axis of the speaker system, and increase to peaks between ±15° and ±40°.

The sound wave of 500 Hz, which belongs to the low frequency range, decreases a little on and around the principal axis (0°), and maintains a substantially fixed level over all of the frequency ranges.

As stated above, the speaker system of the second embodiment of the invention uses three speakers, one of which is a tweeter. The remaining two speakers are each phase-shifted from the tweeter. Accordingly, in the polar pattern, the patterns of the sound waves in the mid- and high-frequency ranges are symmetrical with respect to the principal axis (0°), as shown in FIG. 12. Therefore, the directional characteristics of the speaker system of the second embodiment are improved from those of the speaker system of the first embodiment.

Figure 13:
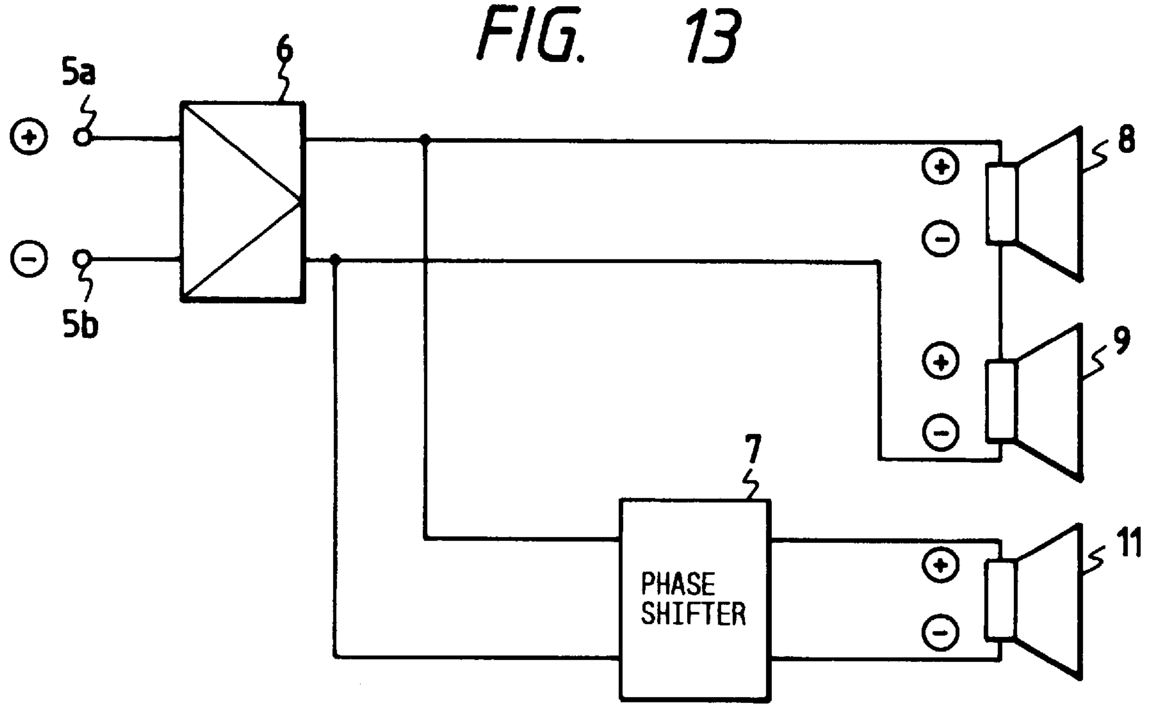
FIG. 13 is a block diagram showing another embodiment according to the invention.

FIG. 13 is a block diagram showing another embodiment of a speaker system according to the present invention.

In FIG. 13, input terminals 5*a* and 5*b* are connected through a power amplifier 6 to all-frequency-range type speakers 8 and 9. The outputs of the power amplifier 6 are connected to an all-frequency-range type speaker 11 through a phase shifter 7.

The speakers 8, 9 and 11 are arranged as shown in FIG. 3.

Thus, in the third embodiment of the invention, the speaker located at the center is phase-shifted from the speakers on both sides of the center speaker. Therefore, the sensitivity patterns of the sound waves in the mid- and high-frequency ranges are more symmetrical with respect to the principal axis (0°) than in the first embodiment. This fact allows further improvement of the directional characteristics of the speaker system.

As seen from the foregoing description, in the speaker system of the present invention, the sensitivities of the sound waves in the mid- and high-frequency ranges are reduced on the principal axis of the speaker system, while those on both sides of the principal axis are increased. Accordingly, even if the speaker system is directed towards a listening position, a listener cannot sense the presence of the speaker system, and therefore a sound field with good presence is created.

What is claimed is:

1. A speaker system for reproducing an audio signal, comprising:

- a power amplifier for providing the audio signal;
- a first speaker for receiving the audio signal from said power amplifier;
- phase shifter means, coupled to receive the audio signal from the power amplifier, for shifting a phase of the received audio signal between ±120° and ±180° in the mid- and high-frequency ranges; and
- a second speaker for receiving the phase-shifted audio signal from said phase shifter means, a composite sound pressure wave of said first and second speakers decreasing on a principal axis (0°) which corresponds to a line of symmetry of respective radiating axes of said first and second speakers; wherein said first and second speakers are mounted in a single cabinet such that the respective distances from said first and second speakers to a listener are equal to each other, and wherein the speaker system reproduces the audio signal such that the principal axis is directed towards the listener.

2. The speaker system as defined in claim 1, wherein each of said first and second speakers is an all-frequency-range type speaker.

3. A speaker system for reproducing an audio signal, comprising:

- a principal axis (0°);
- a power amplifier for providing the audio signal;
- first, second and third speakers, said first and second speakers being connected in series;
- phase shifter means, coupled to receive the audio signal from said power amplifier, for shifting a phase of the received audio signal between ±120° and ±180° in the mid- and high-frequency ranges, said phase shifter means having output terminals connected in series with said series-connected first and second speakers, said phase shifter means shifting the phase of the received audio signal such that a composite sound pressure wave emitted from said first, second and third speakers decreases along the principal axis (0°); and
- high-pass filter for receiving the audio signal from said power amplifier, said third speaker being connected to receive an output of said high-pass filter.

4. The speaker system as defined in claim 3, wherein each of said first and second speakers is an all-frequency-type speaker.

5. The speaker system as defined in claim 3, wherein said third speaker is disposed between said first and second speakers.

* * * * *